United States Patent [19]
Baker

[11] 4,156,837
[45] May 29, 1979

[54] DC STATIC SWITCH CIRCUIT WITH POWER SAVING FEATURE

[75] Inventor: Donal E. Baker, American Township, Allen County, Ohio

[73] Assignee: Westinghouse Electric Corp., Pittsburgh, Pa.

[21] Appl. No.: 787,233

[22] Filed: Apr. 13, 1977

[51] Int. Cl.² .............................................. G05F 1/58
[52] U.S. Cl. ........................................... 323/4; 323/9
[58] Field of Search ............... 323/4, 9; 307/296, 297; 361/87, 98

[56] References Cited
U.S. PATENT DOCUMENTS

| | | | |
|---|---|---|---|
| 3,259,833 | 7/1966 | Barter | 323/9 |
| 3,441,833 | 4/1969 | Bahrs et al. | 323/9 |
| 4,019,096 | 4/1977 | Bullings | 323/9 |

OTHER PUBLICATIONS

Proceedings Of IEEE Power Electronics Specialists Conf." Jun. 1975, "3 Types of S.S. Remote Power Controllers", pp. 1–11.

Primary Examiner—Gerald Goldberg
Attorney, Agent, or Firm—G. H. Telfer

[57] ABSTRACT

A main switch transistor is provided with a base drive circuit to vary the base drive current in accordance with load current to minimize power dissipation. Base drive may also be limited to a maximum for overload current limiting.

2 Claims, 2 Drawing Figures

DC STATIC SWITCH CIRCUIT WITH POWER SAVING FEATURE

GOVERNMENT CONTRACT

The invention described herein was made in the performance of work under NASA contract NASA-9-14000 and is subject to the provisions of Section 305 of the National Aeronautics and Space Act of 1958, Public Law 85-568 (72 Stat. 435; 42 U.S.C. 2457).

BACKGROUND OF THE INVENTION

This invention relates to DC static switching circuits particularly for use in electrical power systems.

As general background to the present invention, reference is made to an article by the present inventor entitled "Three Types of Solid State Remote Power Controllers" appearing in Proceedings of the IEEE "Power Electronics Specialists Conference", June 1975. As is described therein, it is known to provide a transistorized DC static switch with a current limiting feature wherein the switching transistor base is connected in a servo loop with an operational amplifier to control maximum load current. Reference is made particularly to FIG. 8, and the discussion relating thereto, in said article. This form of current limiting provides excellent current control which is independent of supply voltage variations. Such circuits suffer the disadvantage, however, of having undesirable power dissipation for varying load current conditions below the current limiting level.

In applications in which solid state power controllers are particularly suitable, such as airborne applications, efficiency with minimal cost is an important requirement. The former circuit provides full base drive current to the switching transistor continuously during all normal non-overload conditions. That is, the base drive current is independent of load current for levels below current limiting. At full rated load current, the drive losses are approximately $$\frac{(I_L \text{ full load}) (V_L)}{\beta},$$

or about 1% of rated load, where $I_L$ and $V_L$ are load current and supply voltage, respectively, and $\beta$ is the gain of the transistor power switch (approximately 100). This results in an efficiency of no more than about 99% at full load. Allowing for other losses, such as saturation voltage drop, the total losses approach 2 to 3% of full load delivered power giving an actual efficiency of 97 to 98% at rated load for a typical 28 volt DC system. This performance meets normal full load efficiency requirements, but at reduced load current levels the efficiency becomes poor.

At one-tenth of rated load current, for example, the drive losses remain at fixed magnitude, and are 10 times greater from the efficiency standpoint than at full load. These losses now represent about 10% of delivered load power giving a maximum attainable efficiency of less than 90%. Normal operation of solid state power controllers requires frequent use at below full load current and therefore this extra loss of efficiency becomes a significant factor which is desirably to be avoided.

SUMMARY OF THE INVENTION

In accordance with the present invention, a DC static switch has a main switch transistor with a base drive circuit to vary the base drive current in accordance with load current to minimize power dissipation. Base drive may also be limited to a maximum for overload current limiting.

The additional circuit portion in accordance with this invention senses load current, compares it with a reference, and allows the base drive current to vary in accordance with the load current over a range from nearly no load up to the current limiting level. For any given load current there is essentially no overdrive and the efficiency is much better at partial load currents than formerly. The drive losses, due to the base drive current, therefore are fixed at about 1% of the load current regardless of variations in load current. Incidental losses from the extra circuit components will detract from overall efficiency. However, there is still attained a more uniform high efficiency than with prior circuits with only a modest requirement in additional components.

DESCRIPTION OF THE PREFERRED EMBODIMENTS

Figure 1:
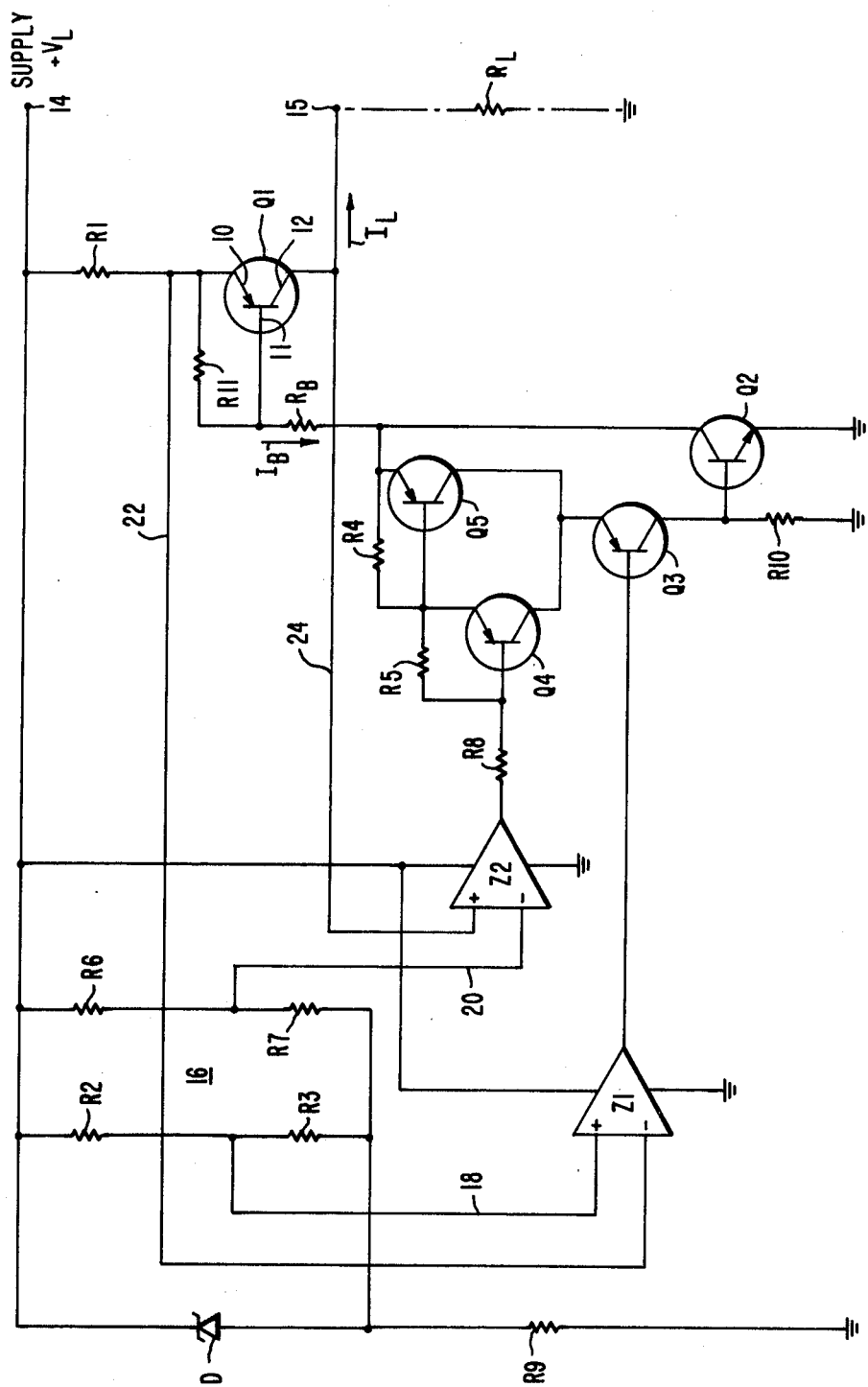
FIG. 1 is a circuit schematic diagram of an embodiment of the present invention in relatively generalized form.

Referring to FIG. 1, the portion of a DC solid state power controller relevant to the present invention is shown, including a transistor power switch Q1 having emitter 10, base 11 and collector 12 electrodes with the emitter and collector electrodes connected between supply and load terminals 14 and 15.

Power switch Q1 is shown for simplicity as a single transistor element in FIG. 1. However, it will be understood there can be additional elements with Q1 which collectively receive base drive in accordance with this invention. For example, in Baker U.S. Pat. No. 3,898,552, Aug. 5, 1975, incorporated by reference herein, is disclosed a D.C. switch with a combination of two transistors, in addition to the main switch, for improvement in surge current pass capability. Such an arrangement is suitable in the practice of the present invention.

To the base electrode of the power switch Q1 is connected a base drive circuit portion in accordance with this invention. The base drive circuit portion has two principal parts which are interrelated. One part, comprising amplifier Z1 and associated components, is for providing current limiting, in accordance with past practice. The other part, comprising amplifier Z2 and associated components, is for providing power saving at reduced load current in accordance with this invention.

Reference voltages for each part of the base drive circuit portion are developed by a resistive network 16 including resistors R2, R3, R6 and R7. Series pairs R2-R3 and R6-R7 are each connected across a voltage reference Zener diode D. The Zener diode D is connected between the supply terminal 14 and ground through a resistor R9. A tap between resistors R2 and R3 provides a current limiting reference voltage on line 18 to one input, the non-inverting input, of the current limiting control operational amplifier Z1. At the center tap between R6 and R7 is developed on line 20 the reference voltage for the power switch saturation control for power saving amplifier Z2 at the inverting terminal of Z2.

Between the supply terminal 14 and the emitter 10 of Q1 is connected a current sensing shunt resistor R1. A line 22 is connected from a point between R1 and Q1 to the inverting input terminal of Z1. Z1 has bias terminals respectively connected to the supply terminal and to ground.

The output terminal of Z1 is connected to the base of transistor Q3. The collector of Q3 is connected to ground through resistor R10 and also is connected to the base of transistor Q2.

Base drive current $I_B$ from Q1, for the polarities shown, goes through base resistor $R_B$ to the collector of Q2 as well as to the emitter of Q5 which is in a Darlington configuration with transistor Q4, R4 and R5 being their emitter-base resistors. The power saving amplifier Z2 has its non-inverting input terminal connected to the circuit load terminal on line 24. The output terminal of Z2 is connected through resistor R8 to the base of Q4.

The loop containing amplifier Z2 allows the base drive current $I_B$ to vary in accordance with the load current over a range of load current from nearly no load up to the current limiting level. The drive losses are now approximately equal to the reciprocal of the saturation gain of Q1 at any particular load current level, including partial load current. Since the gain of Q1 is nearly constant at about 100, the drive losses, due to $I_B$, are fixed at about 1% plus incidental losses due to the extra circuit components.

The resistance of current sensing shunt resistor R1 and the current limiting reference voltage provided by R2 and R3 are selected to provide zero differential input voltage at the inputs of Z1 at the point of current limiting. For load currents below the current limiting level the differential input voltage will cause Z1 to saturate to its negative supply rail, which in this case is ground. Hence, for normal, non-current limiting conditions, Q3 is saturated and does not require consideration with respect to the operation of the power saving amplifier Z2.

The saturation voltage of Q1 is controlled to the power switch saturation voltage reference through Z2, Q2, Q4 and Q5. This saturation voltage is nearly equal to but somewhat more than the classical saturation voltage level of Q1. For a transistor Q1 of type 2N6331 a value of 0.35 volts DC at one ampere fits this requirement. As load current decreases, the current $I_B$ required to keep Q1 at 0.35 volts also decreases giving the desired variable base drive for maximum efficiency. Similarly, as the load current increases, the base drive current $I_B$ will be forced to increase via Z2 until the current limiting level is reached. At this point the current sensing shunt voltage on line 22 will exceed the current limiting reference voltage on line 18 and the output of Z1 will be forced positive in a direction to reduce $I_B$. Reducing $I_B$ under these conditions will cause Q1 saturation voltage to exceed its reference and that will cause Z2 to saturate to its negative supply rail, which is ground in this case, and will saturate Q4 and Q5. As a result, the circuit will switch over and Q1 will be completely controlled by Z1 through Q2 and Q3 in a manner to limit maximum load current flow to the current limiting level regardless of the overload impedance. The switch will remain in this current limiting mode until either the overload is removed and load current returns to normal range or the switch is shut off.

In a sense it can be seen that the circuit in accordance with this invention provides variable base drive for normal operating load currents with an override feature provided by the current limiting part of the base drive circuit portion that sets a maximum on the load current magnitude and cuts off the variable base drive part of the circuit.

Figure 2:
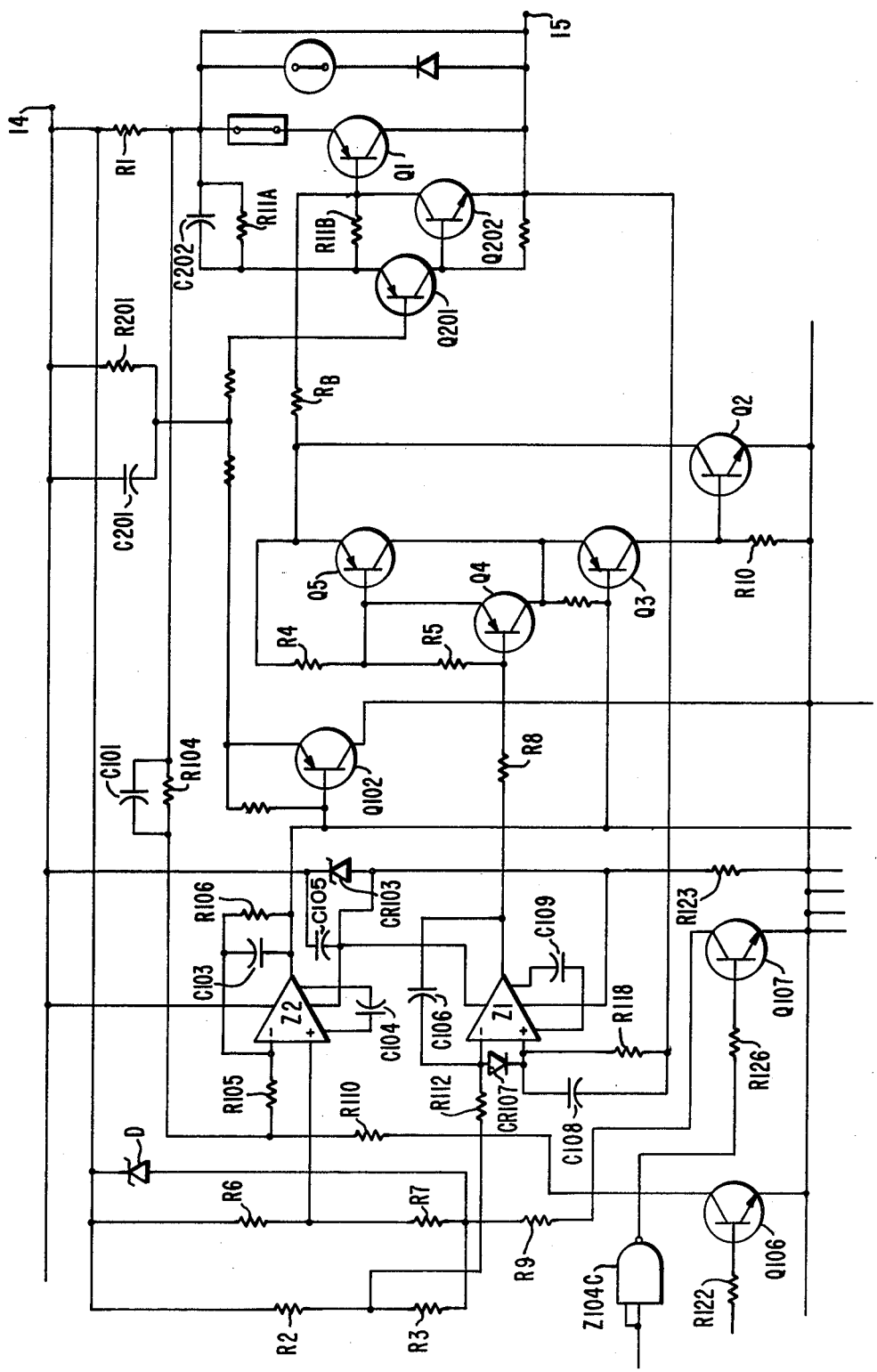
FIG. 2 is a circuit schematic diagram of one embodiment of the present invention in a more detailed form.

FIG. 2 is a somewhat more detailed schematic diagram including those elements shown in FIG. 1 as well as additional incidental circuit elements not believed to require detailed discussion but presented for purposes of a more specific example of the invention. Such circuits have been made and tested in the operation of a 3 ampere, 28 volt DC, solid state power controller, and the following table identifies components as have been used in such power controllers and are presented merely by way of further example.

| COMPONENTS SHOWN IN BOTH FIGS. 1 AND 2 | |
|---|---|
| Component | Identification |
| Transistor Q1 | 2N6331 |
| Transistor Q2 | 2N5681 |
| Transistors Q3, Q4, Q5 | 2N5400 |
| Opamps Z1 and Z2 | 101A |
| Zener diode D | 6.45 V. |
| Resistor $R_B$ | 350 ohms |
| Resistor R1 | 50 mv., 3a., 2% shunt |
| Resistor R2 | 8.5 kilohms |
| Resistor R3 | 150 kilohms |
| Resistor R4 | 82.5 kilohms |
| Resistors R5 and R8 | 1 megohm |
| Resistor R6 | 402 ohms |
| Resistor R7 | 37.4 kilohms |
| Resistor R9 | 5.11 kilohms |
| Resistor R10 | 8.25 kilohms |
| Resistor R11 (parts A and B) | 332 ohms and 100 ohms, resp. |

The following additional components and example values are presented for fuller understanding of FIG. 2:

1. CR103 (39 V.) & R123 (249 ohms): Transient suppression for power supply on Z1 and Z2.

2. R104 (422 ohms) & C101 (3.3 mf.): Load current rise time (di/dt) control when power controller is turned on.

3. R122 (100 K.ohms), R110 (68.1 K.ohms) & Q106 (2N3019): Turn on and turn off of the power controller is accomplished by this circuit working in conjunction with R104, Z2 and the current limiting reference voltage (20). A "hi" input at R122 will turn off the RPC and a "low" will turn on the RPC.

4. Z104C (4011), R126 (47.5 K.ohms) & Q107 (2N3019): This is an economizer circuit which shuts off the reference circuit (R2, R3, R6, R7) when the RPC is off to conserve power.

5. R105 (200 ohms), R106 (10 Megohms), C103 (150 pf.) & C104 (5 pf.): Compensation circuit for gain and stability control of Z2 (and current limiting loop).

6. R112 (1 Megohm), R118 (1 Megohm) & CR107 (1N495B): Differential input voltage protection for Z1 when RPC is off.

7. C106 (20 pf.), C108 (100 pf., 100 V.) & C109 (220 pf.): Compensation circuit for gain and stability control of Z1 (and voltage control loop).

8. C105 (0.01, 100 V.): Power supply by-pass capacitor for stability of Z1 and Z2.

9. C201 (2.2 mf.) & R201 (5.11 K.ohms): Compensation circuit for stabilizing current limiting loop. Also controls load current fall time (di/dt) when RPC is turned off. Also limits peak overshoot current (for applied, low impedance faults) above steady state current limiting level.

10. Q201 (2N5679) & Q202 (2N5681): "Gain shifter" circuit to increase gain of power switch Q1 when not in saturation, i.e., current limiting, turning on or turning off. Ref. U.S. Pat. No. 3,898,552.

11. C202 (1 mf.), R11A: Compensation circuit for power switch stability near full turn off.

From the arrangements shown it will be apparent such power controllers can be made in various other ratings, such as 5, 7.5, 10, 15 and 20 ampere, 28 V. DC units.

The operation of the circuit in accordance with this invention, specifically that of FIG. 2, contrasts with the operation of the same power controller with otherwise the same conditions and components except that it does not include the power saving modification (Z2 and associated components) in accordance with this invention. This is demonstrated by the following table in which variations in power dissipation and efficiency are shown for both the former circuit and the circuit with the improvement of this invention. This clearly demonstrates the much greater uniformity and higher efficiency of operation of the present invention over a relatively wide range of load currents as compared with the former circuit.

TABLE 1

Performance Comparison of 3 Amp, 28 VDC, SSPC With an Without Power Saving Modification

| Load Current | | Old Design | | New Design (With Power Saving Mod.) | |
|---|---|---|---|---|---|
| Amps | % of rated | Dissipation (watts) | Efficiency % | Dissipation (watts) | Efficiency % |
| 3.0 | 100 | 3.0 | 96.4 | 2.1 | 97.47 |
| 2.7 | 90 | 2.85 | 96.2 | 1.9 | 97.46 |
| 2.4 | 80 | 2.7 | 95.95 | 1.75 | 97.37 |
| 2.1 | 70 | 2.55 | 95.6 | 1.6 | 97.25 |
| 1.8 | 60 | 2.4 | 95.2 | 1.4 | 97.19 |
| 1.5 | 50 | 2.3 | 94.5 | 1.25 | 96.99 |
| 1.2 | 40 | 2.25 | 93.24 | 1.1 | 96.69 |
| .9 | 30 | 2.2 | 91.2 | .9 | 96.39 |
| .6 | 20 | 2.15 | 87.1 | .75 | 95.49 |
| .3 | 10 | 2.13 | 74.4 | .55 | 93.38 |
| 0 | 0 | 2.1 | 0 | .5 | 0 |

I claim:

1. A DC static switch circuit with improved efficiency comprising:

a supply terminal for connection to a direct voltage supply;

a load terminal for connection to a load;

a main switch transistor having base, emitter and collector electrodes with said emitter and collector electrodes connected between said supply and load terminals;

a base drive circuit portion connected to said base electrode of said main switch transistor and comprising solid state amplifier means, responsive to load current between said supply and load terminals, for varying drive current magnitude to said base electrode in direct proportion to load current magnitude up to a predetermined rated load current magnitude;

said first mentioned solid state amplifier means comprises an operational amplifier having first and second input terminals, said first terminal being connected to said load terminal and said second terminal being connected to a reference voltage source, said operational amplifier having an output terminal coupled through transistor means to said base electrode.

2. A DC static switch circuit in accordance with claim 1 wherein:

said base drive circuit portion also comprises second solid state amplifier means, responsive to load current between said supply and load terminals for limiting the maximum load current magnitude by limiting drive current magnitude to said base electrode to a maximum.

* * * * *